(12) United States Patent
Economikos et al.

(10) Patent No.: US 6,358,850 B1
(45) Date of Patent: Mar. 19, 2002

(54) SLURRY-LESS CHEMICAL-MECHANICAL POLISHING OF OXIDE MATERIALS

(75) Inventors: Laertis Economikos, Wappingers Falls, NY (US); Sumit Pandey, Boston, MA (US); Ronald J. Schutz, Millbrook; Ravikumar Ramachandran, Ossining, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/471,428

(22) Filed: Dec. 23, 1999

(51) Int. Cl.$^7$ ............................................. H01L 21/302
(52) U.S. Cl. ...................... 438/689; 438/692; 438/693; 216/88
(58) Field of Search ................... 438/691, 692, 438/693, 689; 216/88, 39

(56) References Cited

U.S. PATENT DOCUMENTS

| | | | |
|---|---|---|---|
| 5,702,977 A | * 12/1997 | Jang et al. ................. 437/67 |
| 5,733,176 A | 3/1998 | Robinson et al. ........... 451/41 |
| 5,738,800 A | * 4/1998 | Hosali et al. ............... 216/99 |
| 5,759,917 A | * 6/1998 | Grover et al. .............. 438/690 |
| 5,782,675 A | 7/1998 | Southwick ................. 451/56 |
| 5,855,804 A | 1/1999 | Walker ...................... 216/89 |
| 5,897,426 A | 4/1999 | Somekh ..................... 451/41 |
| 5,919,082 A | 7/1999 | Walker et al. .............. 451/41 |
| 5,958,794 A | 9/1999 | Bruxvoort et al. ......... 438/692 |
| 5,972,124 A | 10/1999 | Sethuraman et al. ......... 134/7 |
| 5,972,792 A | 10/1999 | Hudson ..................... 438/691 |
| 6,120,571 A | * 9/2000 | Aihara et al. .............. 438/693 |
| 6,143,663 A | * 11/2000 | Koutny, Jr. ................ 438/691 |
| 6,180,020 B1 | * 1/2001 | Moriyama et al. .......... 216/88 |

* cited by examiner

*Primary Examiner*—Benjamin L. Utech
*Assistant Examiner*—Duy-Vu Deo
(74) *Attorney, Agent, or Firm*—Steven Capella

(57) ABSTRACT

The invention provides slurry-less chemical-mechanical polishing processes which are effective in planarizing oxide materials, especially siliceous oxides, even where the starting oxide layer has significant topographical variation. The processes of the invention are characterized by the use of a fixed abrasive polishing element and by use of an aqueous liquid medium containing a cationic surfactant for at least a portion of the polishing process involving reduction in the amount of topographic variation (height differential) across the oxide material on the substrate. The method reduces or eliminates the transfer of topographic variations to levels below the desired planarization level.

18 Claims, 3 Drawing Sheets

SLURRY-LESS CHEMICAL-MECHANICAL POLISHING OF OXIDE MATERIALS

BACKGROUND OF THE INVENTION

While a variety of materials configurations exist in integrate circuit structures, a common element for many integrated circuit structures is the dielectric-filled isolation trench. Isolation trenches are widely used to allow the compact arrangement of electrically active components making up the integrated circuit(s) without adverse effects on electrical operability.

When isolation trench structures are formed in a substrate (e.g., by etching), variation in trench depth often occurs between the various trenches formed on the same substrate level on different parts of the wafer. Typically, the variation may be on the order of about 10% of the intended trench depth. To ensure that all the trenches (across the entire wafer) are completely filled with dielectric isolation material, it is typically necessary to deposit sufficient dielectric material to account for the non-uniformity of trench depth.

The necessity to account for variation in trench depth results in an overfill of the shallower trenches and a fairly thick deposit over the wafer surface. Additionally, the dielectric material (typically an oxide) deposited to fill the trenches is typically conformal to some extent. Thus, the local step topography (step height) of the trenches is reflected at least to some extent in the upper surface of the dielectric deposited to fill the trenches. Large step height is normally encountered in combination with a high "within" wafer (overfill) thickness. The deeper (or more narrow the aspect ratio) the trench to be filled, the greater the step height in the dielectric filling layer and the more overfill is required to ensure complete filling of the trench structures across the wafer.

Generally, the objective in polishing is to remove the deposited dielectric material across the wafer so it remains only within the trenches and presents a planar surface for subsequent processing.

Chemical-mechanical polishing (CMP) has been widely used to improve the quality and manufacturability of integrated circuit device structures. CMP enables improved control of the thickness and topography of the material sections making up the device structures.

In the case of large step height and overfill, a reactive ion etching process (to reduce step height in the deposited dielectric material) is typically required in combination with a conventional slurry chemical-mechanical polishing (CMP) process in order to obtain proper planarization. Reactive ion etch processes are not desirably from the point of cost and/or process control.

Conventional slurry-less CMP (alkaline medium —pH= 11—using a fixed abrasive) is generally selective to step height (i.e., capable of reducing step height differential), but where the step height differential is substantial, slurry-less CMP is not capable of performing the necessary material removal without over polishing which results in a non-planar final surface. This deficiency limits use of slurry-less CMP processes to structures with small (e.g., less than 200 Å) variation in trench depth or oxide overfill.

Thus, there is a need for improve polishing processes which are capable of removing material at large step height differential to produce a substantially planar surface while avoiding the need for RIE processing or other undesirable alternatives.

SUMMARY OF THE INVENTION

The invention provides slurry-less chemical-mechanical polishing processes which are effective in planarizing oxide materials, especially siliceous oxides, even where the starting oxide layer has significant topographical variation (e.g., step height differential). The processes of the invention are characterized by the use of a fixed abrasive polishing element and by use of an aqueous liquid medium containing a cationic surfactant for at least a portion of the polishing process involving reduction in the amount of topographic variation (height differential) across the oxide material on the substrate.

In one aspect, the invention encompasses a method of polishing an oxide material layer on a substrate by slurry-less chemical-mechanical polishing, the method comprising:

a) providing a substrate having an oxide material layer on a first surface, the oxide material layer having portions which have a height differential relative to each other, the height being measured from a reference plane parallel with a principal plane of the substrate, b) providing a first aqueous liquid medium containing a cationic surfactant, c) contacting the oxide material layer of the substrate with the first aqueous liquid medium and with a polishing member, the polishing member containing a fixed abrasive component therein, and d) maintaining the contact of step c) while providing movement between the substrate and polishing member, whereby the height differential becomes reduced.

In another aspect, the invention comprises methods having steps (a)–(d) above with the additional steps of:

e) providing a second aqueous liquid medium different from the first medium, the second medium being alkaline, f) contacting the oxide layer resulting from step d) with the second aqueous liquid medium and with a polishing member, the polishing member containing an abrasive component fixed therein, and g) maintaining the contact of step f) while providing movement between the substrate and polishing member, whereby the oxide layer becomes reduced in thickness.

Steps (a)–(d) may be sufficient where the overfill of the trenches is uniform (e.g., less than 200 Å variation across the wafer) and such that by the onset of planarization all oxide has been cleared from the up areas. The process using steps (a)–(g) is preferred where significant step height differential or within wafer oxide thickness exists.

The oxide material to be polished is preferably a dielectric material, more preferably silica or boron phosphosilicate glass (BPSG). The changeover to the second aqueous liquid may involve a discrete step of replacing the first liquid entirely may involve (continuously or discontinuously) modifying the first liquid (e.g., to reduce the concentration of cationic surfactant and/or to increase the alkalinity of the liquid). The height differential in the oxide layer is preferably eliminated or substantially reduced before the changeover to the second aqueous liquid.

These and other aspects of the invention are described in further detail below.

DETAILED DESCRIPTION OF THE INVENTION

Figure 1:
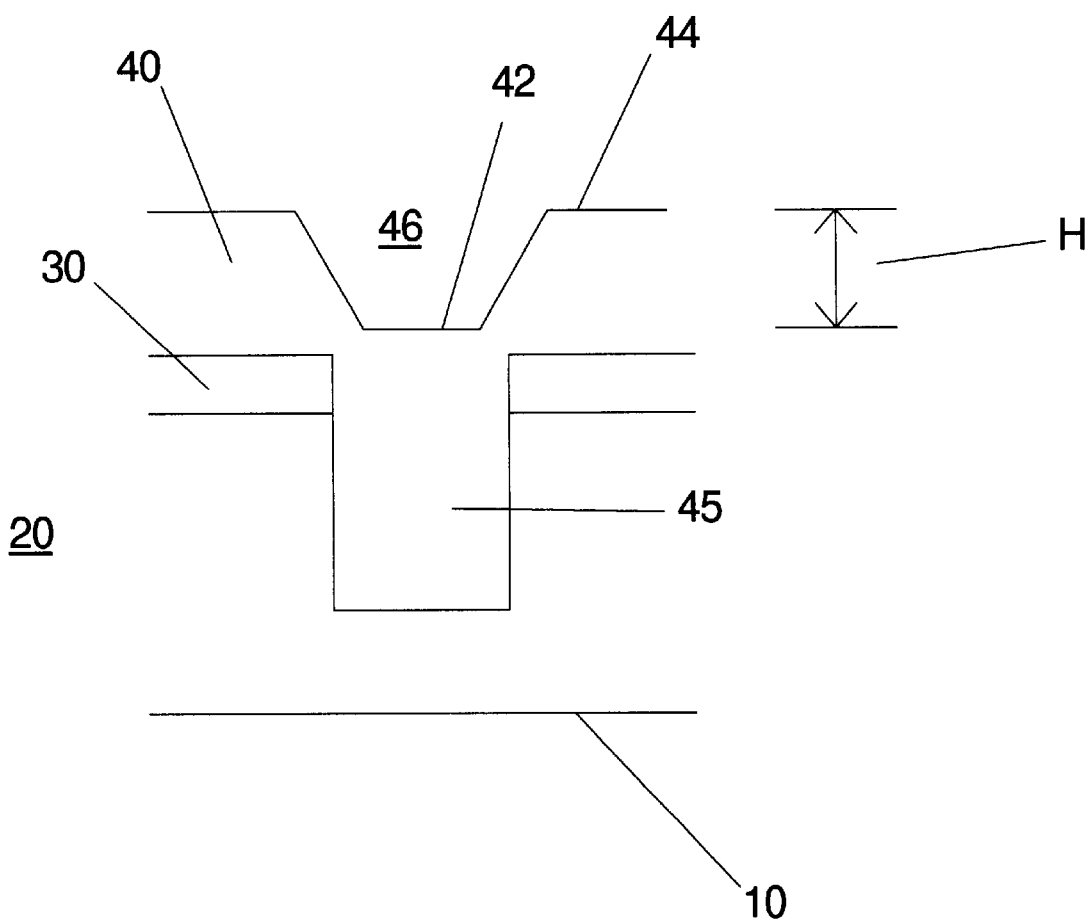
FIG. 1 shows a schematic cross section of a dielectric isolation layer to be planarized on a substrate, the layer having a height differential between portions.

The invention provides slurry-less chemical-mechanical polishing processes which are effective in planarizing oxide materials even where the starting oxide material layer has significant topographical variation. The processes of the invention are characterized by the use of a fixed abrasive polishing element and by use of an aqueous liquid medium containing a cationic surfactant for at least a portion of the polishing process involving reduction in the amount of any topographic variation (height differential) which may exist in the oxide material on the substrate.

In one aspect, the invention encompasses a method of polishing an oxide material layer on a substrate by slurry-less chemical-mechanical polishing, the method comprising:

a) providing a substrate having an oxide material layer on a first surface, the oxide material layer having portions which have a height differential relative to each other, the height being measured from a reference plane parallel with a principal plane of the substrate, b) providing a first aqueous liquid medium containing a cationic surfactant, c) contacting the oxide material layer of the substrate with the first aqueous liquid medium and with a polishing member, the polishing member containing a fixed abrasive component therein, and d) maintaining the contact of step c) while providing movement between the substrate and polishing member, whereby the height differential becomes reduced.

Where significant step height differential or within wafer oxide thickness exists, the methods preferably comprise steps (a)–(d) above with the additional steps of:

e) providing a second aqueous liquid medium different from the first medium, the second medium being alkaline, f) contacting the oxide layer resulting from step d) with the second aqueous liquid medium and with a polishing member, the polishing member containing an abrasive component fixed therein, and g) maintaining the contact of step f) while providing movement between the substrate and polishing member, whereby the oxide layer becomes reduced in thickness.

Alternatively, steps b)–g) may be merged into a continuous process wherein a liquid having a higher cationic surfactant concentration is altered over the course of the polishing process as the height differential of the oxide layer to be polished is reduced.

The processes of the invention are otherwise not limited to use of any specific slurry-less CMP set up or apparatus. Examples of fixed abrasives and other apparatus are disclosed in U.S. Pat. Nos. 5,958,794; 5,855,804; 5,972,124; 5,897,426; 5,733,176; 5,919,082; 5,972,792; or 5,782,675, the disclosures of which are incorporated herein by reference.

The processes of the invention may be used to polish various oxide materials on various substrates, however the processes of the invention are especially useful in the context of oxide dielectric materials and substrates used in the production of integrated circuit devices and/or other microlithographically created articles. The materials to be polished are preferably oxide dielectric materials to be configured or removed in the production of such devices or articles. The processes of the invention are especially useful for the planarization or removal of siliceous oxide materials, more especially silicon dioxide materials. The same technique can be extended to doped silicon dioxide films (e.g., BPSG) also.

The oxide material to be polished may be present without significant topography or may be relatively planar, however, the processes of the invention are especially useful where the initial dielectric oxide layer is non-planar at least in part because it is located over a surface already having at least one location of height differential. An example of such a structure is shown in FIG. 1. The substrate 20 has a first layer 30 (e.g., a silicon nitride stop layer) and a trench 45 (e.g., a trench to be filled with an oxide dielectric isolation material). The oxide material layer 40 overfills trench 45 and oxide layer 40 has a depression 46 therein. The height differential H is the distance between top surface 44 and depression surface 42 measured relative to a reference plane 10. The processes of the invention are especially useful for planarizing layers having height differentials of about 2000 Å or more, especially about 4000 Å or more. A typical height differential of interest will be on the order of about 4000 to 7000 Å.

Oxide material 40 may be provided by various known techniques such as spin-on-glass (SOG) coating, chemical vapor deposition (CVD), physical vapor deposition, high density plasma or other technique. See for example, the various techniques discussed in "Fundamentals of Semiconductor Processing Technologies", by Badih El-Kareh, Kluwer Academic Publishing, 1995 or other texts. Typically, deposition or formation of the dielectric layer 40 over a surface having topography results in topographic variation in the oxide layer 40. In some instances, topographic variation may occur in oxide layer 40 even where the structure underlayer 30 contains no topographic variation (not shown), for example, if the formation of oxide layer 40 is preferential over certain areas of layer 30 (e.g., due to variation of material composition in regions of layer 30 and/or due to the nature of the specific dielectric layer formation step itself). Topographic variation may also occur in oxide layer 40 where the structure underlayer 30 contains a topographic variation within a die and across the wafer. This variation may be attributed to variations in trench 45 depth and width. Layer 40 may contain one or more such regions having a height differential, e.g., where a plurality of trenches 45 are to be filled.

The first aqueous liquid medium is characterized by the presence of cationic surfactant. The first liquid medium preferably contains at least about 0.001 wt. % of cationic surfactant, more preferably at least about 0.003 wt. %, most preferably about 0.003–0.010 wt. %. The cationic surfactant is preferably selected from the group consisting of alkyl trimethyl ammonium compounds, alkyl benzyl ammonium compounds, alkyl pyridinium compounds, alkyl ammonium compounds or mixtures thereof wherein the alkyl is a $C_6$–$C_{18}$ alkyl. More preferably, the cationic surfactant is cetyl pyridinium chloride. The first liquid is preferably alkaline with a pH in the range of about 10–12, more preferably about 11. Any suitable base may be used for establishing the pH level of the solution, however, hydroxides such as ammonium hydroxide are preferred. The first liquid medium may contain other components known in the art, however the first liquid medium preferably consists essentially of water, base and cationic surfactant.

Figure 2:
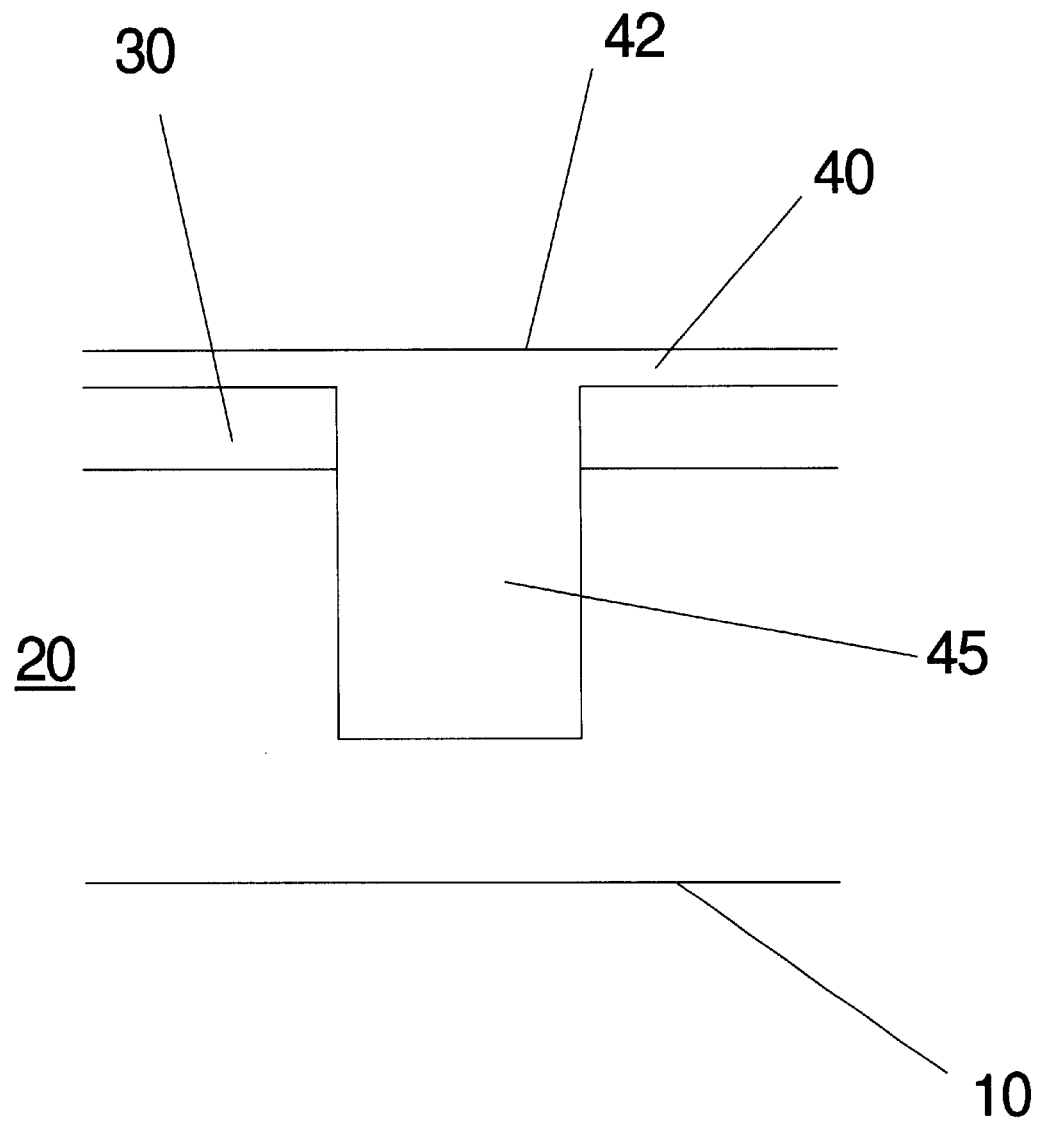
FIG. 2 shows a schematic cross section of a dielectric isolation layer of FIG. 1 after leveling off of the height differential.
Figure 3:
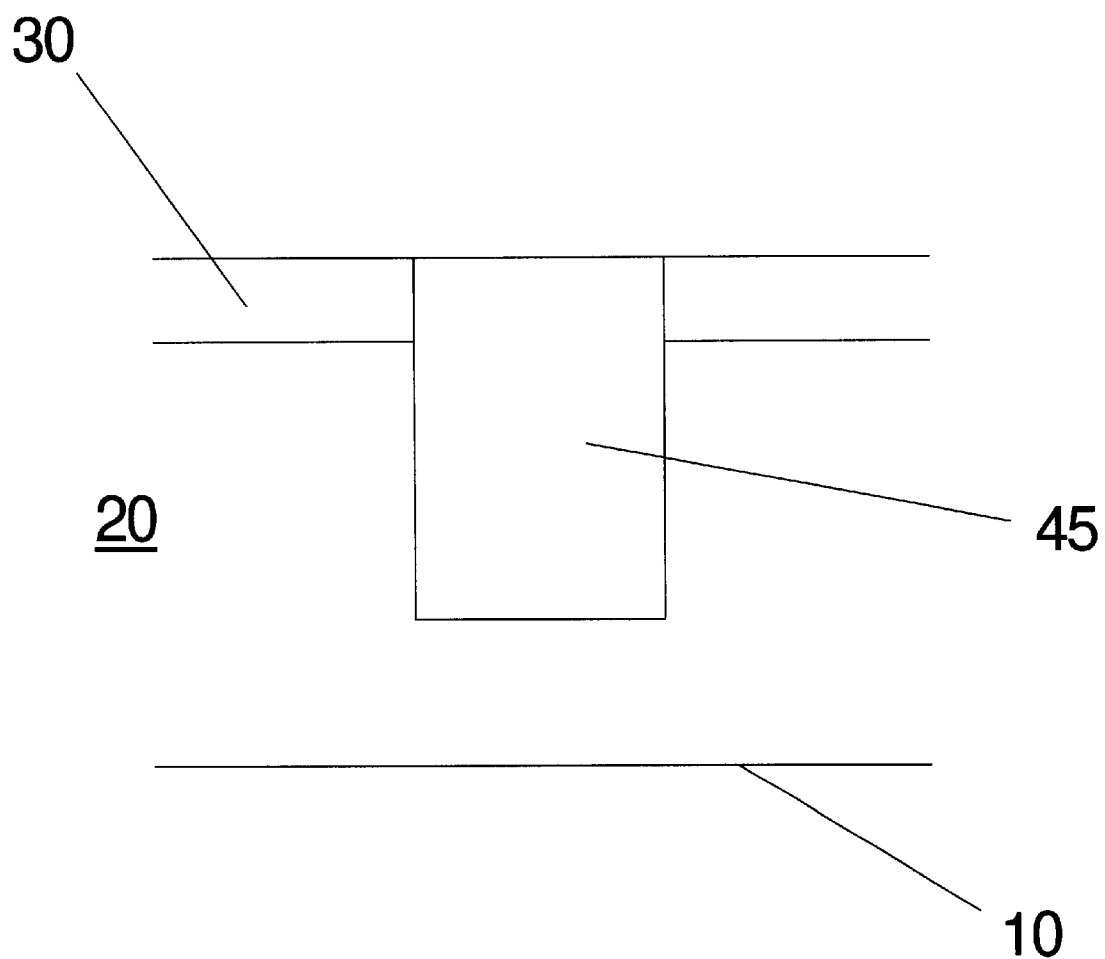
FIG. 3 shows a schematic cross section of a dielectric isolation layer of FIG. 2 after further reduction in height to reveal a stop layer.

The changeover to the second aqueous liquid may involve a discrete step of replacing the first liquid entirely may involve (continuously or discontinuously) modifying the first liquid (e.g., to reduce the concentration of cationic surfactant and/or to increase the alkalinity of the liquid). Before the changeover to the second aqueous liquid, height differential H is preferably reduced to about 200 Å or less for all portions of oxide layer 40, more preferably height differential H is substantially eliminated (e.g., as shown in FIG. 2). The second polishing step is preferably carried out until a desired reduction in thickness is achieved in oxide layer 40 or more preferably until a stop layer 30 is exposed (e.g., as shown in FIG. 3). The polishing step g) may be conducted in the same or different polishing apparatus as polishing step d). As noted above, the second polishing step might not be needed if the overfill of the trenches is uniform (less than 200 Å variation across the die) and such that by the onset of planarization all oxide has been cleared from the up areas 30.

The second aqueous liquid medium is preferably characterized by either the absence of cationic surfactant or the presence of a reduced amount of cationic surfactant compared to the first liquid medium. The second liquid medium preferably contains less than about 0.001 wt. % of cationic surfactant, more preferably substantially no cationic surfactant. The second liquid is preferably alkaline with a pH in the range of about 10–12, more preferably about 11. Any suitable base may be used for establishing the pH level of the solution, however, hydroxides such as ammonium hydroxide are preferred. The second liquid medium may contain other components known in the art, however the second liquid medium preferably consists essentially of water and base.

What is claimed is:

1. A method of polishing an oxide topographic feature on a substrate by slurry-less chemical-mechanical polishing, said method comprising:
    a) providing a substrate having an oxide material layer on a first surface, the oxide material layer having portions which have a height differential relative to each other, the height being measured from a reference plane parallel with a principal plane of the substrate,
    b) providing a first aqueous liquid medium containing a cationic surfactant,
    c) contacting the oxide material layer of the substrate with the first aqueous liquid medium and with a polishing member, the polishing member containing a fixed abrasive component therein,
    d) maintaining the contact of step c) while providing movement between the substrate and polishing member, whereby the height differential becomes reduced, and
    e) providing a second aqueous liquid medium different from the first medium, the second medium being alkaline,
    f) contacting the oxide layer resulting from step d) with the second aqueous liquid medium and with a polishing member, the polishing member containing an abrasive component fixed therein, and
    g) maintaining the contact of step f) while providing movement between the substrate and polishing member, whereby the oxide layer becomes reduced in thickness.

2. The method of claim 1 wherein said oxide layer contains at least one topographically non-uniform feature having a height differential of at least about 2000 Å.

3. The method of claim 2 wherein said feature has a height differential of at least about 4000 Å.

4. The method of claim 1 wherein said oxide is a siliceous oxide.

5. The method of claim 2 wherein said substrate contains a plurality of said topographic oxide features.

6. The method of claim 1 wherein said first liquid medium contains at least about 0.001 wt. % of said cationic surfactant.

7. The method of claim 1 wherein said first liquid medium contains at least about 0.003 wt. % of said cationic surfactant.

8. The method of claim 1 wherein said first liquid medium contains about 0.003–0.010 wt. % of said cationic surfactant.

9. The method of claim 1 wherein said first liquid medium is alkaline.

10. The method of claim 1 wherein said first liquid medium has a pH of at least about 10.

11. The method of claim 1 wherein said second liquid contains less of said cationic surfactant than said first liquid.

12. The method of claim 1 wherein said second liquid is substantially free of cationic surfactant.

13. The method of claim 1 wherein said second liquid has a pH of at least about 10.

14. The method of claim 13 wherein said second liquid has a pH of about 10 to 12.

15. The method of claim 1 wherein said cationic surfactant is selected from the group consisting of alkyl trimethyl ammonium compounds, alkyl benzyl ammonium compounds, alkyl pyridinium compounds, alkyl ammonium compounds or mixtures thereof wherein said alkyl is a $C_6$–$C_{18}$ alkyl.

16. The method of claim 1 wherein said polishing members used in steps c) and f) comprise a particulate abrasive material fixed in a binder medium.

17. The method of claim 1 wherein said polishing is conducted in step g) until at least a portion of an underlying material layer on said substrate is exposed.

18. The method of claim 17 wherein said underlying layer comprises a nitride material.

* * * * *